United States Patent
Kim et al.

(10) Patent No.: US 9,252,268 B2
(45) Date of Patent: Feb. 2, 2016

(54) ARRAY SUBSTRATE FOR DISPLAY DEVICE

(71) Applicant: LG DISPLAY CO., LTD., Seoul (KR)

(72) Inventors: Jeong-Hwan Kim, Seoul (KR); Ki-Sul Cho, Gumi-Si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/475,182

(22) Filed: Sep. 2, 2014

(65) Prior Publication Data

US 2015/0144905 A1    May 28, 2015

(30) Foreign Application Priority Data

Nov. 22, 2013 (KR) .................. 10-2013-0143114

(51) Int. Cl.
| | |
|---|---|
| H01L 29/04 | (2006.01) |
| H01L 31/0376 | (2006.01) |
| H01L 31/20 | (2006.01) |
| H01L 31/036 | (2006.01) |
| H01L 29/78 | (2006.01) |
| H01L 27/32 | (2006.01) |
| H01L 27/12 | (2006.01) |

(52) U.S. Cl.
CPC ........ *H01L 29/7831* (2013.01); *H01L 27/1222* (2013.01); *H01L 27/3244* (2013.01); *H01L 27/3262* (2013.01)

(58) Field of Classification Search
None
See application file for complete search history.

(56) References Cited

U.S. PATENT DOCUMENTS

| | | | | |
|---|---|---|---|---|
| 6,476,416 B1 * | 11/2002 | Ikeda | ............................. | 257/59 |
| 6,717,638 B1 * | 4/2004 | Kim | ............................. | 349/106 |
| 6,746,905 B1 * | 6/2004 | Fukuda | ........................ | 438/164 |
| 8,525,165 B2 * | 9/2013 | Akimoto | ........................ | 257/43 |
| 8,546,180 B2 * | 10/2013 | Yamazaki et al. | ............ | 438/104 |
| 2005/0037550 A1 * | 2/2005 | Kang et al. | .................... | 438/166 |
| 2007/0120116 A1 * | 5/2007 | Han | ............................. | 257/40 |
| 2011/0017999 A1 * | 1/2011 | Choi | ............................. | 257/72 |

\* cited by examiner

*Primary Examiner* — Mary Wilczewski
*Assistant Examiner* — Khanh Duong
(74) *Attorney, Agent, or Firm* — Birch, Stewart, Kolasch & Birch, LLP

(57) ABSTRACT

The present invention provides a display device and a dual gate type thin film transistor (TFT) structure for an electronic device. According to an embodiment, the dual gate TFT structure includes a first gate electrode formed on a substrate; a semiconductor layer formed on the first gate electrode; an insulating layer formed on the semiconductor layer, and including first, second and third contact holes therein; drain and source electrodes in contact with the semiconductor layer respectively through the first and second contact holes; a passivation layer formed on the drain electrode and the source electrode, and including a fourth contact hole therein; a planarization layer formed on the passivation layer, and including a fifth contact hole therein; and a second gate electrode formed on the planarization layer, and in electrical contact with the first gate electrode through the third, fourth and fifth contact holes.

21 Claims, 6 Drawing Sheets

ARRAY SUBSTRATE FOR DISPLAY DEVICE

The present application claims the benefit of Korean Patent Application No. 10-2013-0143114 filed in Korea on Nov. 22, 2013, which is herein incorporated by reference.

BACKGROUND OF THE INVENTION

1. Technical Field

The present invention relates to a display device, and more particularly, to an array substrate for a display device having a dual-gate structure and preventing an electrical short.

2. Discussion of the Related Art

Recently, as the society has entered an information age, various types of display devices that represent all sorts of electrical signals as visual images have been developed rapidly. For example, a liquid crystal display (LCD) device and an organic light emitting diode (OLED) display device have been widely introduced and used as a substitute for a display device of cathode-ray tube type.

A general LCD device has characteristics of light weight, thinness and low power consumption. A general OLED display device of new flat panel display devices has high brightness and low driving voltage. The OLED display device is a self-emitting type and has excellent characteristics of a view angle, a contrast ratio, a response time and so on.

The LCD device can include array elements on a first substrate and color filters on a second substrate. The array element for the LCD device includes a gate line, a data line, a thin film transistor (TFT) as a switching element and a pixel electrode. The array element for the LCD device may further include a common electrode.

On the other hand, the OLED display device can include array elements on a substrate and an organic light emitting diode connected to each array element. The array element for the OLED display device includes a switching thin film transistor (TFT) (which is connected to a gate line and a data line), a driving TFT (which is connected to the switching TFT), and a power line connected to the driving TFT. The organic light emitting diode includes a first electrode (which is connected to the driving TFT), an organic emitting layer and a second electrode. In the OLED display device, light from the organic emitting layer passes through the first electrode or the second electrode to display an image.

As known, both of the LCD device and the OLED display device according to the related art require the substrate including the array elements. The substrate here may be referred to as an array substrate.

The TFT according to the related art includes a semiconductor layer of amorphous silicon, poly-silicon or an oxide semiconductor material. The TFT including the semiconductor layer of poly-silicon or the oxide semiconductor material has an advantage in mobility such that it is widely used for the OLED display device. Recently, the TFT including the semiconductor layer of the oxide semiconductor material can be made with an improved fabricating process such that it is more widely used. In addition, a dual gate type TFT having improved properties than a single gate type TFT is introduced.

FIG. 1 is a schematic cross-sectional view of an array substrate for the related art OLED display device. A driving region DA and an emitting region EA are defined in each pixel region P among a plurality of pixel regions Ps.

As shown in FIG. 1, the OLED display device according to the related art includes an array substrate 1. For each of a plurality of driving regions DAs in the array substrate 1, a first gate electrode 15 is formed on a substrate 10, and a gate insulating layer 18 is formed on the first gate electrode 15.

In each driving region DA, a semiconductor layer 20, which is formed of an oxide semiconductor material, is formed on the gate insulating layer 18 to correspond to the first gate electrode 15, and an etch stopper 23, which is formed of an inorganic insulating material, is formed on the semiconductor layer 20. The etch stopper 23 includes semiconductor contact holes 25 exposing both ends of the semiconductor layer 20.

A source electrode 33 and a drain electrode 36 are formed on the etch stopper 23. The source and drain electrodes 33 and 36 respectively contact the semiconductor layer 20 through the semiconductor contact holes 25.

A passivation layer 40 including a first drain contact hole 43 is formed on the source and drain electrodes 33 and 36. A portion of the drain electrode 36 is exposed through the first drain contact hole 43. In addition, a gate contact hole "gch" exposing the first gate electrode 15 is formed through the passivation layer 40, the etch stopper 23 and the gate insulating layer 18.

An auxiliary drain electrode 56 contacting the drain electrode 36 through the first drain contact hole 43 is formed on the passivation layer 40. In addition, a second gate electrode 54 contacting the first gate electrode 15 through the gate contact hole "gch" is formed on the passivation layer 40. The second gate electrode 54 is spaced apart from the auxiliary drain electrode 56, overlaps the source electrode 33, and is closely located to the drain electrode 36.

The first gate electrode 15, the semiconductor layer 20, the source electrode 33, the drain electrode 36, the auxiliary drain electrode 56 and the second gate electrode 54 constitute a driving TFT DTr in each driving region DA.

A planarization layer 60 having a flat top surface is formed on the auxiliary drain electrode 56 and the second gate electrode 54. The planarization layer 60 includes a second drain contact hole 63 exposing the auxiliary drain electrode 56.

A first electrode 70 contacting the auxiliary drain electrode 56 through the second drain contact hole 63 is formed on the planarization layer 60. The first electrode 70 is positioned in the emitting region EA. A bank 71 overlapping an edge of the first electrode 70 is formed on the planarization layer 60. The bank 71 is positioned in the driving region DA and surrounds the pixel region P.

An organic emitting layer 73 is formed on the first electrode 70 and in the emitting region EA, and a second electrode 76 is formed on the organic emitting layer 73. The first electrode 70, the organic emitting layer 73 and the second electrode 76 constitute an organic emitting diode E in each emitting region EA.

In FIG. 1, the organic emitting diode E is formed on the substrate 10 with the driving TFT DTr. Alternatively, the organic emitting diode E can be formed on an opposite substrate. In this instance, the array substrate for the OLED display device includes the driving TFT and an electrode as a connection electrode.

On the other hand, the array substrate for the LCD device includes a TFT shown in FIG. 1 and a pixel electrode, which is connected to the TFT, with or without a common electrode. Namely, both the array substrate for the OLED display device and the array substrate for the LCD device include TFTs and electrodes. The TFT in FIG. 1 is a dual gate type TFT.

As illustrated above, in the dual gate type TFT, the first and second gate electrodes 15 and 54 are disposed under and over the semiconductor layer 20, respectively. In addition, the first and second gate electrodes 15 and 54 are in direct contact with each other and are electrically connected to each other.

A channel is securely formed in the semiconductor layer 20 in the dual gate type TFT such that an ON current property of the dual gate type TFT is improved in comparison to a TFT including a single gate electrode. In addition, a stain problem resulting from a non-uniformity of the TFT is decreased such that an image quality is improved.

However, there may be a problem in the operation of the TFT according to the related art. In the related art dual gate type TFT as shown in FIG. 1, an electrical short problem is generated between the drain electrode 36 and the second gate electrode 54 and between the source electrode 33 and the second gate electrode 54. As a result, the TFT is not properly operated.

In more detail, the passivation layer 40, which is formed of an inorganic insulating material, is formed between the drain electrode 36 and the second gate electrode 54 and between the source electrode 33 and the second gate electrode 54, and has a thickness of 2000 to 4000 angstroms. Each of the source and drain electrodes 33 and 36 and the second gate electrode 54 is formed of a low resistance metallic material such as copper (Cu), Cu alloy, aluminum (Al) or Al alloy (AlNd).

Particularly, when the source and drain electrodes 33 and 36 and the second gate electrode 54, each of which is formed of Cu or Al, are exposed to a relatively high temperature, e.g., 200 to 300° C., in a sputtering process or a chemical vapor deposition process, the material of the source and drain electrodes 33 and 36 and the second gate electrode 54 is migrated into the passivation layer 40 such that an electrical short problem is generated between the drain electrode 36 and the second gate electrode 54 and between the source electrode 33 and the second gate electrode 54. FIG. 2 is a picture depicting an example of such Cu migration into the passivation layer 40 causing an electrical short problem. This negatively affects the operation of the dual gate type TFT according to the related art.

SUMMARY OF THE INVENTION

Accordingly, the present invention is directed to an array substrate for a display device that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with the present invention, as embodied and broadly described herein, the present invention provides a display device including a first gate electrode and a gate insulating layer both formed on a substrate; a semiconductor layer formed on the gate insulating layer; an etch stopper formed on the gate insulating layer, and including first, second and third contact holes therein; a drain electrode and a source electrode both formed on the etch stopper, and both in contact with the semiconductor layer respectively through the first and second contact holes; a first auxiliary pattern in contact with the first gate electrode through the third contact hole; a passivation layer formed on the drain electrode and the source electrode, and including a fourth contact hole therein; a second auxiliary pattern in contact with the first auxiliary pattern through the fourth contact hole; a planarization layer formed on the passivation layer and the second auxiliary pattern, and including a fifth contact hole herein; and a second gate electrode formed on the planarization layer, and in contact with the second auxiliary pattern through the fifth contact hole.

According to an embodiment, the present invention provides a dual gate type thin film transistor (TFT) structure for an electronic device, the structure comprising: a first gate electrode formed on a substrate; a semiconductor layer formed on the first gate electrode; an insulating layer formed on the semiconductor layer, and including first, second and third contact holes therein; drain and source electrodes in contact with the semiconductor layer respectively through the first and second contact holes; a passivation layer formed on the drain electrode and the source electrode, and including a fourth contact hole therein; a planarization layer formed on the passivation layer, and including a fifth contact hole therein; and a second gate electrode formed on the planarization layer, and in electrical contact with the first gate electrode through the third, fourth and fifth contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the invention, examples of which are illustrated in the accompanying drawings.

Figure 1:
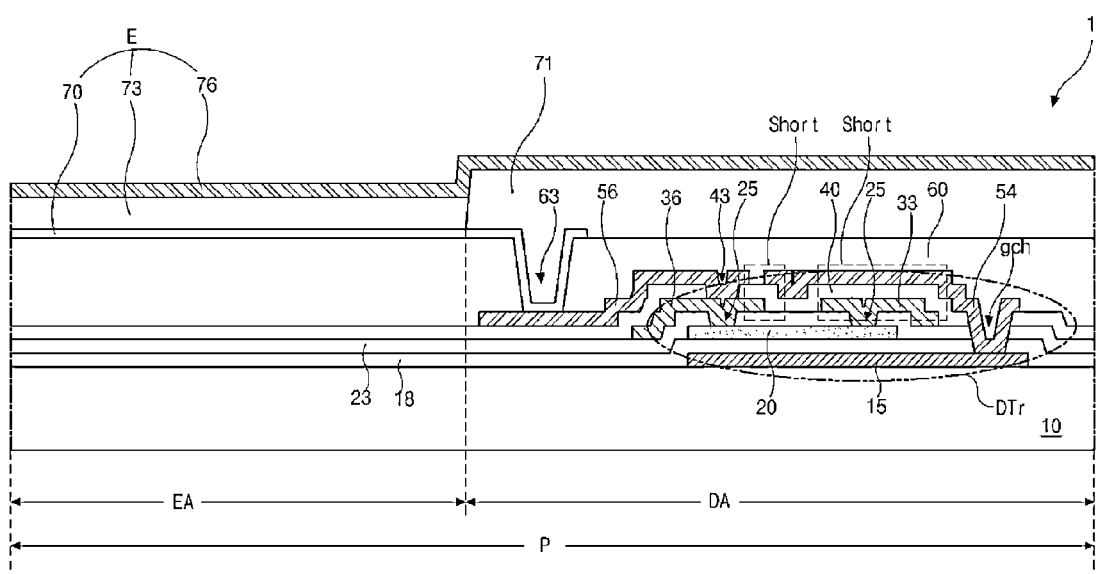
FIG. 1 is a schematic cross-sectional view of an array substrate for the related art OLED display device.
Figure 2:
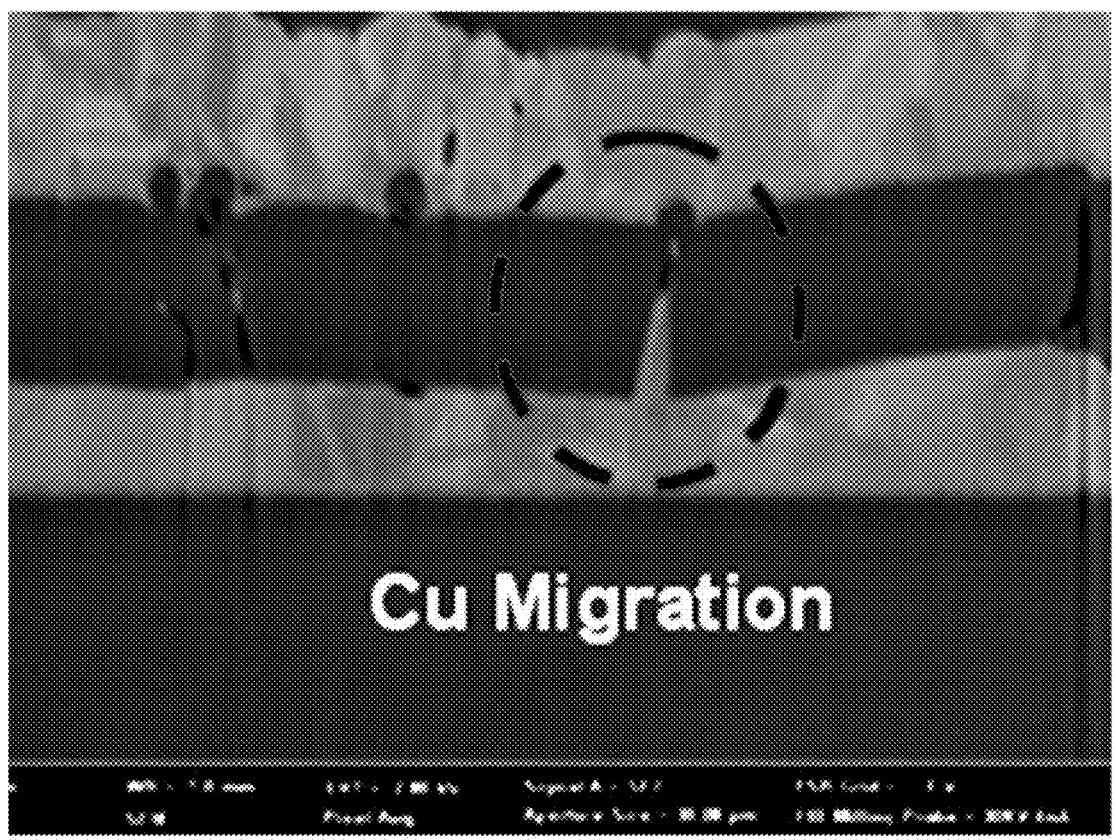
FIG. 2 is a picture showing an electrical short between the source electrode and the second gate electrode of FIG. 1.
Figure 3:
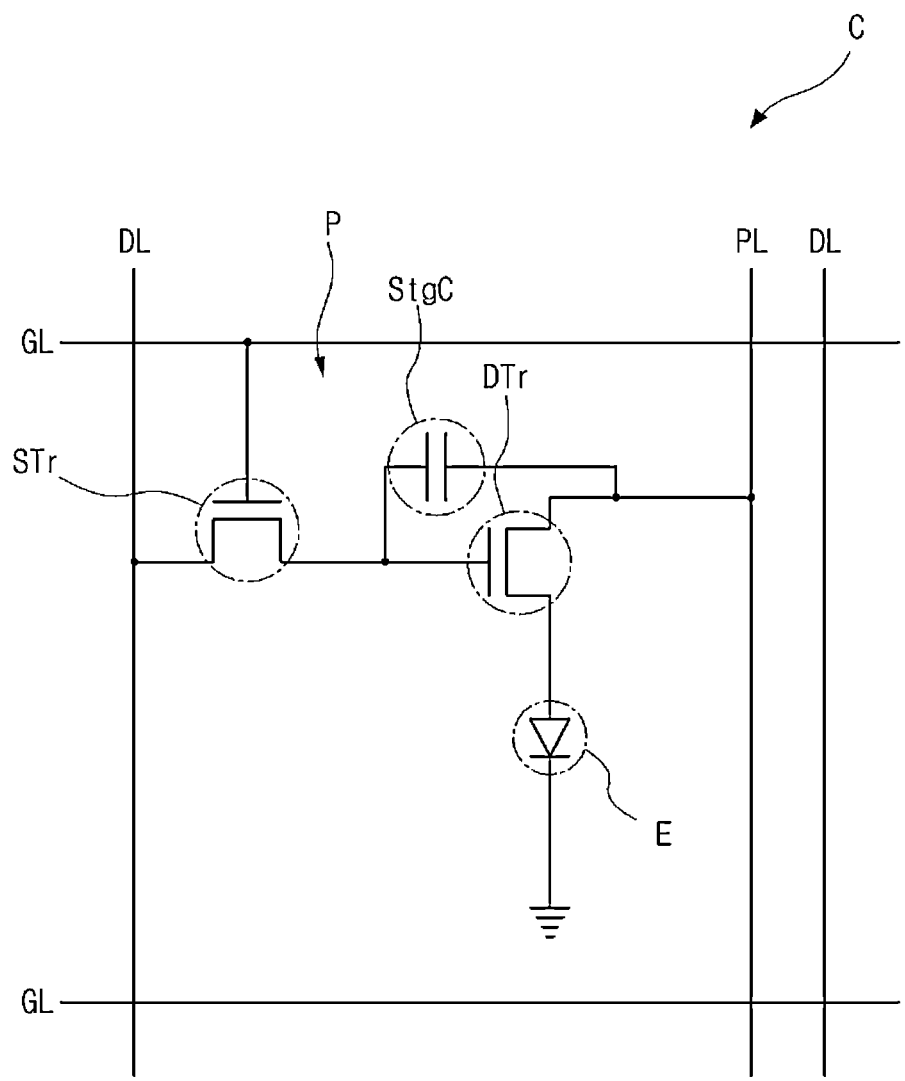
FIG. 3 is a circuit diagram of one sub-pixel region of an OLED display device according to an example of the present invention.

FIG. 3 is a circuit diagram of one sub-pixel region of an OLED display device according to an example of the present invention.

As shown in FIG. 3, an OLED display device includes a configuration/structure C in each pixel region P of a plurality of pixel regions. That is, the OLED display device includes multiples of the configuration C of FIG. 3 in a matrix configuration. Each configuration C includes a switching thin film transistor (TFT) STr, a driving TFT DTr, a storage capacitor StgC and an organic emitting diode E in each pixel region P. The OLED display device includes All the components of the OLED display device or any other types of display devices according to the present invention are operatively coupled and configured.

On a substrate, a gate line GL along a first direction and a data line DL along a second direction are formed. The gate line GL and the data line DL cross each other to define the pixel region P. A power line PL for providing a voltage to the emitting diode E is formed to be parallel to and spaced apart from the data line DL.

The switching TFT STr is connected to the gate and data lines GL and DL, whereas the driving TFT DTr and the storage capacitor StgC are connected to the switching TFT STr and the power line PL. The organic emitting diode E is connected to the driving TFT DTr.

A first electrode of the organic emitting diode E is connected to a drain electrode of the driving TFT DTr, and a second electrode of the organic emitting diode E is grounded.

When the switching TFT STr is turned on by a gate signal applied through the gate line GL, a data signal from the data line DL is applied to the gate electrode of the driving TFT DTr and an electrode of the storage capacitor StgC. When the driving TFT DTr is turned on by the data signal, an electric current is supplied to the organic emitting diode E from the power line PL. As a result, the organic emitting diode E emits light. In this case, when the driving TFT DTr is turned on, a level of an electric current applied from the power line PL to the organic emitting diode E is determined such that the organic emitting diode E can produce a gray scale. The storage capacitor StgC serves to maintain the voltage of the gate electrode of the driving TFT DTr when the switching TFT STr is turned off. Accordingly, even if the switching TFT STr is turned off, a level of an electric current applied from the power line PL to the organic emitting diode E is maintained to the next frame.

Although FIG. 3 shows a single driving TFT DTr in one pixel region P, as a variation at least two driving TFTs may be formed in one pixel region P to securely drive the organic emitting diode.

Figure 4:
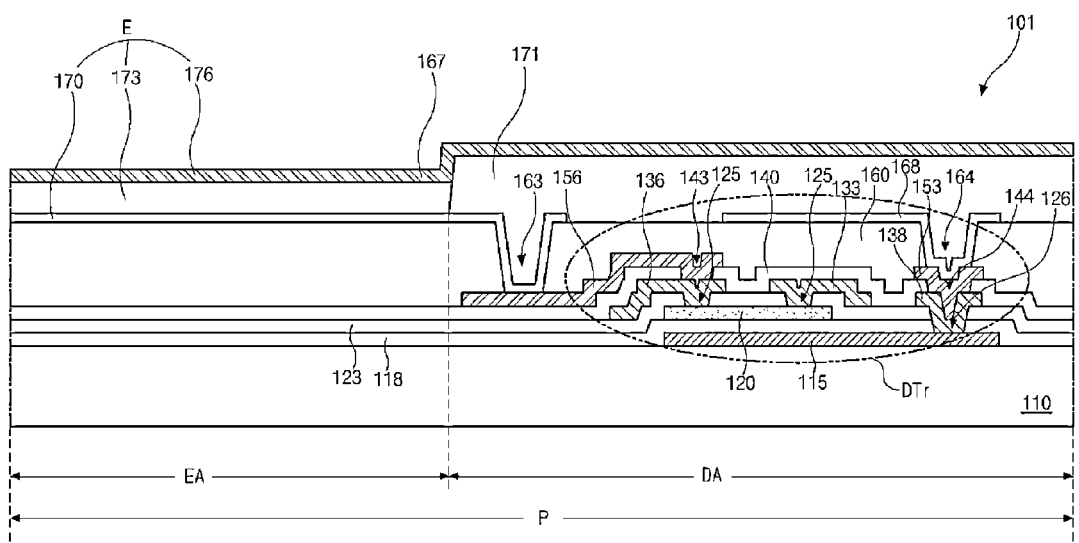
FIG. 4 is a schematic cross-sectional view of an array substrate for an OLED display device according to a first embodiment of the present invention.

FIG. 4 is a schematic cross-sectional view of an array substrate for an OLED display device according to a first embodiment of the present invention. The OLED display device in FIG. 4 and all other figures according to the embodiments of the present invention are operatively coupled and configured. Particularly, the OLED display device includes an array substrate 101 and an opposite substrate for encapsulating organic emitting diodes. The array substrate includes a plurality of pixel regions Ps, and a driving region DA and an emitting region EA are defined in each pixel region P. The OLED display device may further include an encapsulation film including an inorganic layer and/or an organic layer instead of the opposite substrate.

As shown in FIG. 4, the array substrate 101 for the OLED display device includes a driving TFT DTr in each driving region DA and an organic emitting diode E formed on a substrate 110. The organic emitting diode E is electrically connected to the driving TFT DTr. The driving TFT DTr is positioned in each driving region DA, and the organic emitting diode E is positioned in each emitting region EA.

Although not shown, a gate line and a data line are formed on the substrate 110. The gate and data lines cross each other to define the pixel region P. A power line is formed on the substrate 110 to be parallel to the gate line or the data line. A switching TFT is formed in each pixel region P. The switching TFT is electrically connected to the gate line and the data line. The driving TFT DTr is connected to the switching TFT. FIG. 4 shows one driving TFT DTr in one pixel region P. Alternatively, at least two driving TFTs may be formed in one pixel region. The driving TFT DTr is also connected to the power line and the organic emitting diode E.

The driving TFT DTr includes a first gate electrode 115, a semiconductor layer 120, a source electrode 133, a drain electrode 136, an auxiliary drain electrode 156 and a second gate electrode 168. The driving TFT DTr further includes first and second auxiliary patterns 138 and 153 for an electrical connection between the first and second gate electrodes 115 and 168. The gate line is formed on the same layer and of the same material as the first gate electrode 115, and each of the data line and the power line is formed of the same layer and of the same material as the source electrode 133.

The first gate electrode 115 is connected to the switching TFT, and the source electrode 133 is connected to the power line. The first gate electrode 115 is formed on the substrate 110. The first gate electrode 115 has a single-layered structure or a multi-layered structure and is formed of a low resistance metallic material such as Al, Al alloy, Cu, Cu alloy, molybdenum (Mo) or Mo alloy (MoTi). Although not shown, the gate line is formed on the substrate 110.

A gate insulating layer 118 is formed on the first gate electrode 115 and the gate line (not shown). The gate insulating layer 118 is formed of an inorganic insulating layer, e.g., silicon oxide or silicon nitride.

The semiconductor layer 120 having an island shape is formed on the gate insulating layer 118 to correspond to the first gate electrode 115. The semiconductor layer 120 is formed of an oxide semiconductor material, e.g., indium gallium zinc oxide IGZO), zinc tin oxide (ZTO), zinc indium oxide (ZIO) or zinc oxide (ZO).

An etch stopper 123 is formed over an entire surface of the substrate 110 including the semiconductor layer 120. The etch stopper 123 is formed of an inorganic insulating layer, e.g., silicon oxide or silicon nitride.

Semiconductor contact holes 125 exposing both ends of the semiconductor layer 120 is formed through the etch stopper 123. In addition, a gate contact hole 126 exposing the first gate electrode 115 is formed through the etch stopper 123 and the gate insulating layer 118.

In FIG. 4, only the etch stopper 123 is removed in the semiconductor contact holes 125 such that a top surface of the semiconductor layer 120 is exposed through the semiconductor contact holes 125. Alternatively, as shown in FIG. 5, which is a schematic cross-sectional view of an array substrate for an OLED display device according to a second embodiment of the present invention, not only the portions of the etch stopper 123 but also the portions of the semiconductor layer 120 are removed such that a top surface of the gate insulating layer 118 is exposed through the semiconductor contact holes 125.

Figure 5:
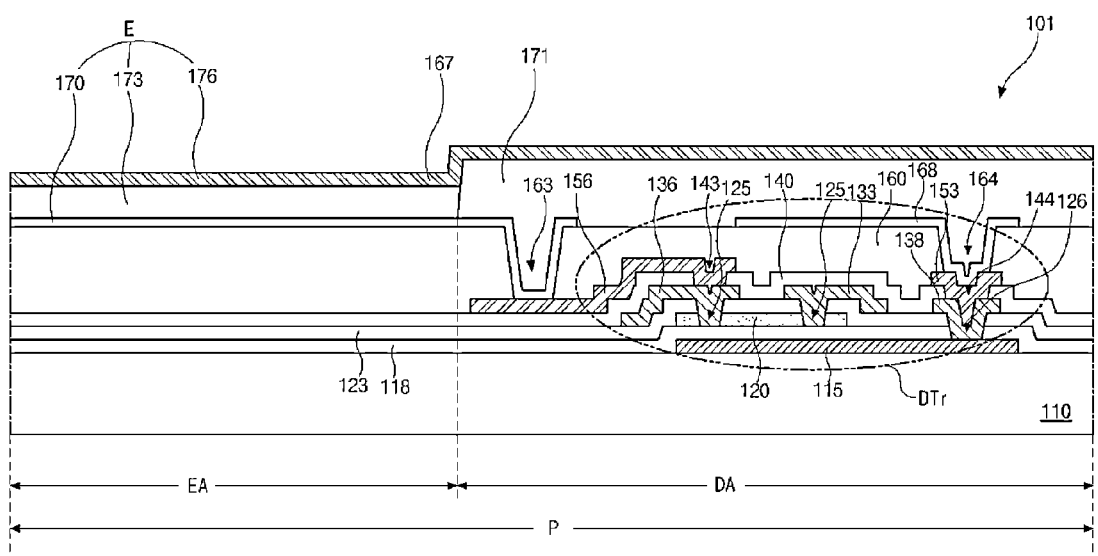
FIG. 5 is a schematic cross-sectional view of an array substrate for an OLED display device according to a second embodiment of the present invention.

By forming the semiconductor contact holes 125 through the etch stopper 123 and the semiconductor layer 120 as shown in FIG. 5, a contact area between the source electrode 133 and the semiconductor layer 120 and between the drain electrode 136 and the semiconductor layer 120 becomes uniform.

In the example of FIG. 4, when portions of the etch stopper 123 are etched to form the semiconductor contact holes 125 therein by a dry-etching process, some portions of the semiconductor layer 120 may be etched unintentionally by an etching gas of the dry-etching process. An etching amount of the semiconductor layer 120 may be different in the semiconductor contact hole 125 for the source electrode 133 and in the semiconductor contact hole 125 for the drain electrode 136. In this instance, the size of a contact area between the source electrode 133 and the semiconductor layer 120 may become different than the size of a contact area between the drain electrode 136 and the semiconductor layer 120 such that a property deviation of the TFTs may occur according to their positions. As a result, an image quality may be degraded.

However, by forming the semiconductor contact holes 125 through the etch stopper 123 and the semiconductor layer 120 as shown in FIG. 5, the above problems can be prevented or reduced. When the source electrode 133 and the drain electrode 136 contact side surfaces of the exposed portions of the semiconductor layer 120 in the semiconductor contact holes 125, which are formed through the etch stopper 123 and the semiconductor layer 120, an area between the source electrode 133 and the semiconductor layer 120 becomes substantially equal to a contact area between the drain electrode 136 and the semiconductor layer 120 such that the degradation of the image quality resulting from the contact area deviation is prevented or minimized.

Referring again to FIG. 4, the source electrode 133 and the drain electrode 136 are formed on the etch stopper 123. Each of the source and drain electrodes 133 and 136 has a single-layered structure or a multi-layered structure and can be formed of a low resistance metallic material such as Al, Al alloy, Cu, Cu alloy, molybdenum (Mo) or Mo alloy (MoTi). The source electrode 133 and the drain electrode 136 contact the top surface of the semiconductor layer 120 through the semiconductor contact holes 125.

Alternatively, as shown in FIG. 5, the source electrode 133 and the drain electrode 136 contact the side surfaces of the semiconductor layer 120 through the semiconductor contact holes 125.

Referring again to FIG. 4, the first auxiliary pattern 138, which contacts the first gate electrode 115 through the gate contact hole 126 and is spaced apart from the source and drain electrodes 133 and 136, is formed on the etch stopper 123 and in the gate contact hole 126. The first auxiliary pattern 138 is formed on the same layer and of the same material as the source and drain electrodes 133 and 136. The first auxiliary pattern 138 is formed for a secure connection between the first gate electrode 115 and the second gate electrode 168.

A passivation layer 140 including a first drain contact hole 143 and a first auxiliary contact hole 144 is formed on the source and drain electrodes 133 and 136 and the first auxiliary pattern 138. The first drain contact hole 143 exposes the drain electrode 136, and the first auxiliary contact hole 144 exposes the first auxiliary pattern 138. The passivation layer 140 can be formed of an inorganic insulating material such as silicon oxide or silicon nitride.

An auxiliary drain electrode 156, which contacts the drain electrode 136 through the first drain contact hole 143, and a second auxiliary pattern 153, which contacts the first auxiliary pattern 138 through the first auxiliary contact hole 144, are formed on the passivation layer 140 using a low resistance metallic material. The auxiliary drain electrode 156 and the second auxiliary pattern 153 can be formed using the same material at the same time.

The second auxiliary pattern 153 is spaced apart from the source electrode 133 and the drain electrode 136. Namely, the second auxiliary pattern 153 does not overlap with the source electrode 133 and the drain electrode 136. Accordingly, an electrical short problem between the source electrode 133 and the second auxiliary pattern 153 and between the drain electrode 136 and the second auxiliary pattern 153 does not occur or is mitigated. An electrical connection between the first gate electrode 115 and the second gate electrode 168 is secured and established through the second auxiliary pattern 153 with the first auxiliary pattern 138.

A planarization layer 160 is formed on the auxiliary drain electrode 156, the second auxiliary pattern 153 and the passivation layer 140. The planarization layer 160 is formed of an organic insulating material and has a flat top surface. The planarization layer 160 includes a second drain contact hole 163 exposing the auxiliary drain electrode 156, and a second auxiliary contact hole 164 exposing the second auxiliary pattern 153. The second drain contact hole 163 and the second auxiliary contact hole 164 can be formed at the same time.

A first electrode 170, which contacts the auxiliary drain electrode 156 through the second drain contact hole 163, is formed on the planarization layer 160. In the OLED display device, the first electrode 170 can be formed of a material having a relatively high work function, e.g., indium tin oxide (ITO), to serve as an anode. On the other hand, the organic emitting diode E is formed on an opposite substrate, and the first electrode 170 may be formed of a low resistance metallic material. In the LCD device, the first electrode 170 serves as a pixel electrode.

In addition, a second gate electrode 168 is formed on the planarization layer 160 and in the second auxiliary contact hole 164. Namely, the second gate electrode 168 is disposed over the source electrode 133 and the drain electrode 136 but is separated from the passivation layer 140 by the planarization layer 160. The second gate electrode 168 contacts the second auxiliary pattern 153 through the second auxiliary contact hole 164. Namely, the second gate electrode 168 is electrically connected to the first gate electrode 115 via the first and second auxiliary patterns 138 and 153. Each of the first and second auxiliary patterns 138 and 153 may be formed of a conductive material. The second gate electrode 168 is formed of the same material as the first electrode 170, and can be formed at the same time with the first electrode 170 using a same fabrication process.

In the driving TFT DTr having the above structure, not only the passivation layer 140 but also the planarization layer 160 are disposed between the source electrode 133 and the second auxiliary pattern 153 and between the drain electrode 136 and the second auxiliary pattern 153 does not occur or is mitigated. Even though the metallic material of the source and drain electrodes 133 and 136 is migrated into the passivation layer 140, the migrated metallic material is blocked by the planarization layer 160 having a larger thickness, e.g., above 1 µm, than the passivation layer 140.

Accordingly, the driving TFT DTr has a dual gate structure with the first and second gate electrodes 115 and 168, and the electrical short problem between the source electrode 133 and the second auxiliary pattern 153 and between the drain electrode 136 and the second auxiliary pattern 153 does not occur or is mitigated can be prevented or minimized.

Although not shown, the switching TFT, which is electrically connected to the gate line, the data line and the driving TFT DTr, is formed on the substrate 110. The switching TFT may have the same structure as the driving TFT or a single gate structure.

When the switching TFT has the single gate structure, the first and second auxiliary patterns 138 and 153, the second gate electrode 168 and the auxiliary drain electrode 156 may be omitted. In addition, the gate contact hole 126, the first and second auxiliary contact holes 144 and 164, and the first drain contact hole 143 may be omitted. Namely, the single gate type switching TFT includes a gate electrode, a semiconductor layer, a source electrode and a drain electrode.

On the other hand, when the switching TFT includes an auxiliary drain electrode, the passivation layer 140 includes a contact hole exposing the drain electrode, and the auxiliary drain electrode, which contacts the drain electrode through the contact hole, is formed on the passivation layer 140. In addition, the switching TFT may include an auxiliary source electrode with or without the auxiliary drain electrode. In this instance, the passivation layer 140 includes a source contact hole exposing the source electrode, and the auxiliary source electrode, which contacts the source electrode through the source contact hole, is formed on the passivation layer 140.

In the array substrate of the present invention, the driving TFT DTr has a dual gate structure as shown in FIGS. 4 and 5, where the first and second gate electrodes 115 and 168 are disposed respectively under and over the semiconductor layer 120, such that the ON current property (Ion) is improved. In other words, the semiconductor layer 120 is positioned between the first and second gate electrodes 115 and 168. In addition, since the electrical short problem between the source electrode 133 and the second auxiliary pattern 153 and between the drain electrode 136 and the second auxiliary pattern 153 does not occur or is mitigated, the production yield of the display device is improved.

On the first electrode 170 and the second gate electrode 168, a bank 171 is formed. The bank 171 surrounds edges of the first electrode 170 and covers the second gate electrode 170. In other words, the bank 171 surrounds the emitting area and exposes a center of the first electrode 170. The bank 171 covers an entire of the driving region DA. The bank 171 may be formed of a black resin or a transparent organic insulating material such as polyimide.

On the first electrode 170 where the bank 171 is not formed, an organic emitting layer 173 is formed. The organic emitting layer 173 contacts the first electrode 170 exposed through the bank 171.

On the first electrode 170, a second electrode 176, which covers an entire surface of a display region of the array substrate, is formed. The second electrode 176 is formed of a metallic material having a relatively low work function to serve as a cathode. The second electrode 176 may be formed of at least one of Al, Al alloy, silver (Ag), magnesium (Mg), gold (Au) and Al—Mg alloy (AlMg).

The first and second electrodes 170 and 176 and the organic emitting layer 173 constitute the organic emitting diode E.

Although not shown, a first emission enhancing layer and a second emission enhancing layer may be formed between the first electrode 170 and the organic emitting layer 173 and between the organic emitting layer 173 and the second electrode 176, respectively, to increase an emitting efficiency of the organic emitting diode E. Each of the first and second emission enhancing layers may have a multi-layered structure.

For example, the first emission enhancing layer may include a hole injection layer on the first electrode 170, and a hole transporting layer on the hole injection layer. The second emission enhancing layer may include an electron transporting layer on the organic emitting layer 173, and an electron injection layer on the electron transporting layer. The first emission enhancing layer may further include an electron blocking layer, and the second emission enhancing layer may further include a hole blocking layer.

On the other hand, the first emission enhancing layer may have a single-layered structure of the hole injection layer or the hole transporting layer on the hole injection layer, and the second emission enhancing layer may have a single-layered structure of the an electron transporting layer or the electron injection layer.

Figure 6:
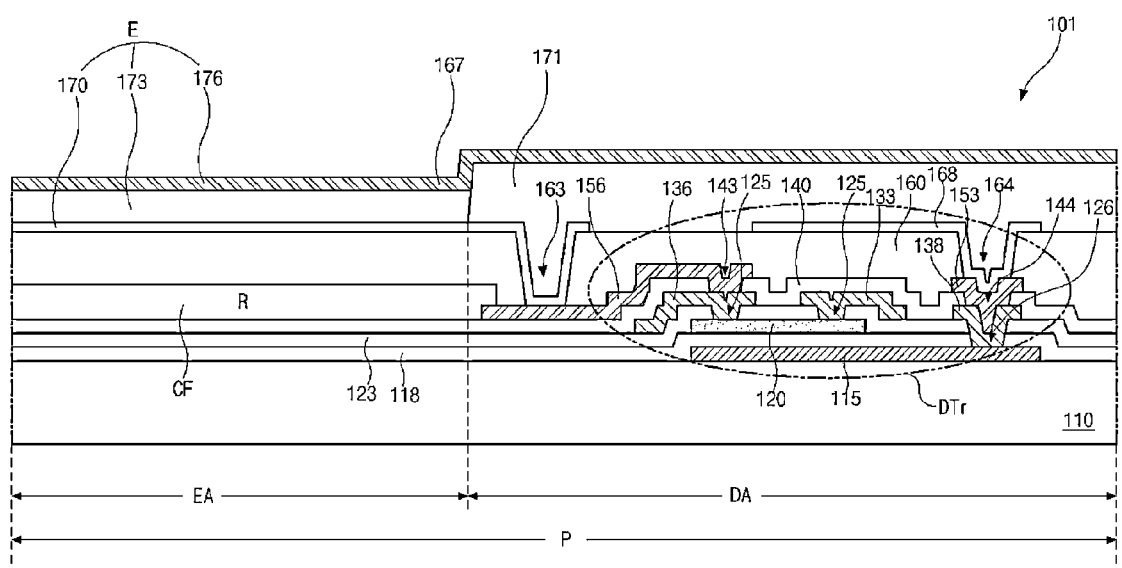
FIG. 6 is a schematic cross-sectional view of an array substrate for an OLED display device according to a third embodiment of the present invention.

Referring to FIG. 6, which is a schematic cross-sectional view of an array substrate for an OLED display device according to a third embodiment of the present invention, the array substrate 101 of FIG. 4 (or FIG. 5) further includes a color filter pattern "CF" in each emitting region EA. The color filter pattern "CF" has one of red, green and blue colors. In FIG. 6, the color filter pattern "CF" has the red color. The color filter pattern "CF" in another pixel region has the green color or the blue color such that the color filter patterns "CFs" having the red, green and blue colors are provided in the array substrate. The color filter pattern "CF" is positioned between the passivation layer 140 and the planarization layer 160.

In this instance, the organic emitting layer 173 emits white light, and the light from the organic emitting layer 173 passes through the color filter pattern "CF" to produce full color images. On the other hand, one or more pixel regions may not include the color filter pattern "CF" such that the contrast ratio is increased with the red, green, blue and white lights.

In another example, the organic emitting layer 173 can be configured so that the organic emitting layer 173 itself emits red, green and blue color lights without the use of the color filter pattern "CF" to produce full color images. In that example, the color filter pattern "CF" may not be needed.

Although not shown, an opposite substrate for encapsulation the organic emitting diode E is disposed over the array substrate 101, and an adhesive pattern can be formed along edges of the array substrate 101 and the opposite substrate. The array substrate 101 and the opposite substrate can be attached to each other by the adhesive pattern with a vacuum condition or an inert gas condition therebetween to form a display panel. The opposite substrate may be a flexible plastic substrate or a glass substrate.

On the other hand, the OLED display device may include an encapsulation film, which includes an inorganic layer and/or an organic layer and serves as a camping layer, instead of the opposite substrate.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
a first gate electrode and a gate insulating layer both formed on a substrate;
a semiconductor layer formed on the gate insulating layer;
an etch stopper formed on the gate insulating layer, and including first, second and third contact holes therein;
a drain electrode and a source electrode both formed on the etch stopper, and both in contact with the semiconductor layer respectively through the first and second contact holes;
a first auxiliary pattern in contact with the first gate electrode through the third contact hole;
a passivation layer formed on the drain electrode and the source electrode, and including a fourth contact hole therein;
a second auxiliary pattern in contact with the first auxiliary pattern through the fourth contact hole;
a planarization layer formed on the passivation layer and the second auxiliary pattern, and including a fifth contact hole herein; and
a second gate electrode formed on the planarization layer, and in contact with the second auxiliary pattern through the fifth contact hole.

2. The display device of claim 1, further comprising:
an electrode layer formed on the planarization layer and being adjacent to the second gate electrode,
wherein the second gate electrode and the electrode layer are formed with a same material.

3. The display device of claim 1, wherein the second gate electrode is separated from the passivation layer by the planarization layer formed between the second gate electrode and the passivation layer.

4. The display device of claim 1, wherein the first auxiliary pattern, the second auxiliary pattern and the second gate electrode are stacked on top of each other on the first gate electrode in the third, fourth and fifth contact holes.

5. The display device of claim 1, further comprising:
an auxiliary drain electrode formed on the passivation layer, and in contact with the drain electrode through the planarization layer.

6. The display device of claim 5, further comprising:
an organic light emitting diode (OLED) structure in electrical contact with the drain electrode through the auxiliary drain electrode.

7. The display device of claim 6, wherein the OLED structure includes:
a first electrode formed on the planarization layer, and in contact with the auxiliary drain electrode through the planarization layer;
an organic emitting layer formed on the first electrode of the OLED structure; and
a second electrode formed on the organic emitting layer.

8. The display device of claim 1, wherein the semiconductor layer further includes first and second semiconductor layer contact holes respectively formed below the first and second contact holes.

9. The display device of claim 8, wherein the drain electrode is in contact with the gate insulating layer through the first contact hole and the first semiconductor layer contact hole, and
the source electrode is in contact with the gate insulating layer through the second contact hole and the second semiconductor layer contact hole.

10. The display device of claim 1, further comprising:
a color filter pattern formed on the passivation layer and under the planarization layer.

11. The display device of claim 10, wherein the semiconductor layer further includes first and second semiconductor layer contact holes respectively formed below the first and second contact holes.

12. The display device of claim 11, wherein the drain electrode is in contact with the gate insulating layer through the first contact hole and the first semiconductor layer contact hole, and
the source electrode is in contact with the gate insulating layer through the second contact hole and the second semiconductor layer contact hole.

13. A dual gate type thin film transistor (TFT) structure for an electronic device, the structure comprising:
a first gate electrode formed on a substrate;
a semiconductor layer formed on the first gate electrode;
an insulating layer formed on the semiconductor layer, and including first, second and third contact holes therein;
drain and source electrodes in contact with the semiconductor layer respectively through the first and second contact holes;
a passivation layer formed on the drain electrode and the source electrode, and including a fourth contact hole therein;
a planarization layer formed on the passivation layer, and including a fifth contact hole therein; and
a second gate electrode formed on the planarization layer, and in electrical contact with the first gate electrode through the third, fourth and fifth contact holes.

14. The structure of claim 13, further comprising:
an electrode layer formed on the planarization layer and being adjacent to the second gate electrode,
wherein the second gate electrode and the electrode layer are formed with a same material.

15. The structure of claim 13, further comprising:
at least one auxiliary pattern formed in at least one of the third and fourth contact holes, and in contact with the first and second gate electrodes.

16. The structure of claim 15, wherein the at least one auxiliary pattern includes first and second auxiliary patterns, and
the first and second auxiliary patterns and the second gate electrode are stacked on top of each other on the first gate electrode in the third, fourth and fifth contact holes.

17. The structure of claim 13, wherein the second gate electrode is separated from the passivation layer by the planarization layer formed between the second gate electrode and the passivation layer.

18. The structure of claim 13, further comprising:
an auxiliary drain electrode formed on the passivation layer, and in contact with the drain electrode through the planarization layer.

19. The structure of claim 13, further comprising:
a gate insulating layer formed between the first gate electrode and the semiconductor layer,
wherein the semiconductor layer further includes first and second semiconductor layer contact holes respectively formed below the first and second contact holes.

20. The structure of claim 19, wherein the drain electrode is in contact with the gate insulating layer through the first contact hole and the first semiconductor layer contact hole, and
the source electrode is in contact with the gate insulating layer through the second contact hole and the second semiconductor layer contact hole.

21. The structure of claim 13, further comprising:
a color filter pattern formed on the passivation layer and under the planarization layer.

* * * * *